(12) United States Patent
Kato et al.

(10) Patent No.: US 8,933,340 B2
(45) Date of Patent: *Jan. 13, 2015

(54) SIGNAL TRANSMISSION LINE AND CIRCUIT BOARD

(71) Applicant: Murata Manufacturing Co., Ltd., Nagaokakyo-shi, Kyoto-fu (JP)

(72) Inventors: Noboro Kato, Nagaokakyo (JP); Jun Sasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/872,305

(22) Filed: Apr. 29, 2013

(65) Prior Publication Data

US 2013/0234808 A1      Sep. 12, 2013

Related U.S. Application Data

(63) Continuation of application No. 13/286,298, filed on Nov. 1, 2011, now Pat. No. 8,450,614, which is a continuation of application No. PCT/JP2010/055087, filed on Mar. 24, 2010.

(30) Foreign Application Priority Data

May 11, 2009   (JP) .................................. 2009-114378

(51) Int. Cl.
  *H05K 1/00*   (2006.01)
  *H01P 3/08*   (2006.01)
  *H05K 1/02*   (2006.01)
  *H05K 1/03*   (2006.01)

(52) U.S. Cl.
  CPC .............. *H01P 3/082* (2013.01); *H05K 1/0219* (2013.01); *H05K 1/028* (2013.01); *H05K 1/0298* (2013.01); *H05K 1/0393* (2013.01); *H05K 2201/09672* (2013.01); *H05K 2201/09727* (2013.01)
  USPC ........... 174/254; 174/257; 361/749; 361/794; 361/799; 361/818

(58) Field of Classification Search
  USPC .......... 174/254, 257; 361/749, 792, 794, 799, 361/800, 803, 816, 818; 333/238, 241, 244, 333/245–247
  See application file for complete search history.

(56) References Cited

U.S. PATENT DOCUMENTS 5,003,273  A  *  3/1991  Oppenberg ........................ 333/1
2006/0050490 A1 *  3/2006  Ootani ........................... 361/755

OTHER PUBLICATIONS

Kato et al., "Signal Transmission Line and Circuit Board", U.S. Appl. No. 13/286,298, filed Nov. 1, 2011.

* cited by examiner

*Primary Examiner* — Hoa C Nguyen
(74) *Attorney, Agent, or Firm* — Keating & Bennett, LLP (57) ABSTRACT

A signal line and a circuit board that can be easily bent in a U shape and prevent unwanted emission include a line portion includes a plurality of laminated line portion sheets made of a flexible material. Signal lines extend within the line portion in an x-axis direction. Ground lines are provided within the line portion on a positive direction side in a z-axis direction with respect to the signal lines and have line widths equal to or smaller than the line widths of the signal lines. Ground lines are provided within the line portion on a negative direction side in the z-axis direction with respect to the signal lines. The signal lines overlap the ground lines when seen in a planar view from the z-axis direction.

7 Claims, 6 Drawing Sheets

SIGNAL TRANSMISSION LINE AND CIRCUIT BOARD

BACKGROUND OF THE INVENTION

1. Field of the Invention

The present invention relates to a signal transmission line and a circuit board, and more specifically, relates to a signal transmission line and a circuit board in which a high-frequency signal is transmitted.

2. Description of the Related Art

Figure 8A:
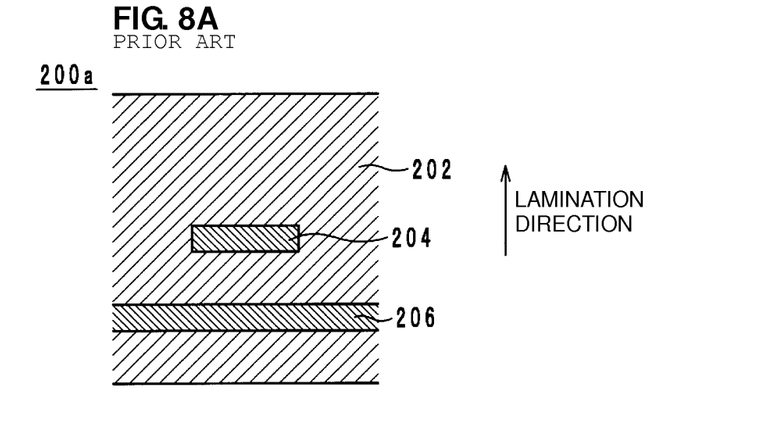
FIG. 8A is a cross-sectional structure diagram of the microstrip line described in Japanese Unexamined Patent Application Publication No. 2004-152963.
Figure 8B:
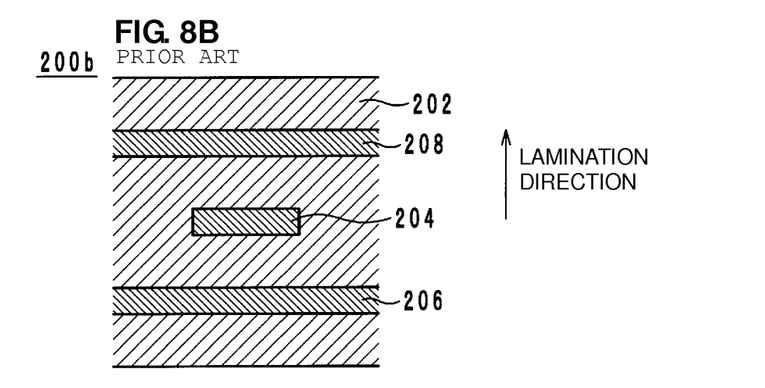
FIG. 8B is a cross-sectional structure diagram of the strip line described in Japanese Unexamined Patent Application Publication No. 2004-152963.

As existing signal transmission lines, for example, the microstrip line and the strip line that are described in Japanese Unexamined Patent Application Publication No. 2004-152963 are known. FIG. 8A is a cross-sectional structure diagram of the microstrip line 200a described in Japanese Unexamined Patent Application Publication No. 2004-152963, and FIG. 8B is a cross-sectional structure diagram of the strip line 200b described in Japanese Unexamined Patent Application Publication No. 2004-152963. In FIGS. 8A and 8B, the up-down direction is defined as a lamination direction.

The microstrip line 200a shown in FIG. 8A is composed of a main body 202, a signal line 204, and a ground conductor 206. The main body 202 is composed of, for example, a plurality of laminated insulating sheets formed from a flexible material. The signal line 204 is a wiring in which a high-frequency signal is transmitted, and extends in the direction perpendicular to the sheet surface of FIG. 8A. A ground potential is applied to the ground conductor 206, and the ground conductor 206 is provided on the lower side of the signal line 204 in the lamination direction. The signal line 204 and the ground conductor 206 overlap each other when seen in a planar view from the lamination direction.

The microstrip line 200a described above is used, for example, for connecting a signal generation source to a load circuit in a state where impedance matching is provided therebetween. Specifically, in the microstrip line 200a, a capacitance occurs between the signal line 204 and the ground conductor 206, and the impedance of the signal line 204 decreases. Thus, impedance matching is provided among the signal generation source, the signal line 204, and the load circuit.

However, in the microstrip line 200a, unwanted emission occurs. Specifically, a high-frequency signal has a wavelength shorter than the electrical length of the microstrip line 200a. Thus, when a high-frequency signal is transmitted in the signal line 204, a plurality of standing waves is present in the signal line 204. Due to the standing waves, noise is emitted from the signal line 204. Of the noise, the noise emitted to the lower side in the lamination direction is absorbed by the ground conductor 206. However, the noise emitted to the upper side in the lamination direction is emitted from the signal line 204 to the outside of the main body 202.

Meanwhile, in the strip line 200b shown in FIG. 8B, unwanted emission can be suppressed. Specifically, the strip line 200b has a structure in which a ground conductor 208 is provided in the microstrip line 200a. As shown in FIG. 8B, the ground conductor 208 is provided on the upper side of the signal line 204 in the lamination direction. The signal line 204 and the ground conductor 208 overlap each other when seen in a planar view from the lamination direction. In the strip line 200b having the structure described above, noise emitted from the signal line 204 is absorbed by the ground conductor 208. Thus, in the strip line 200b, unwanted emission can be suppressed.

However, the strip line 200b has a problem that it is difficult to bend the strip line 200b in a U shape. Specifically, the strip line 200b is composed of three conductor layers, namely, the signal line 204 and the ground conductors 206 and 208. The signal line 204 and the ground conductors 206 and 208 are in general produced from a metal film such as copper foil, and thus it is difficult to bend these elements as compared to the insulating sheets constituting the main body 202. Therefore, the strip line 200b has a problem in that it is relatively difficult to bend the strip lines 200b in a U shape.

As described above, in the existing microstrip line 200a and strip line 200b, it is difficult to achieve both suppression of unwanted emission and easy bending in a U shape.

SUMMARY OF THE INVENTION

Therefore, preferred embodiments of the present invention provide a signal transmission line and a circuit board that can easily be bent in a U shape and that can prevent unwanted emission.

A signal transmission line according to a preferred embodiment of the present invention includes a line portion including laminated insulating sheets made of a flexible material; a signal line extending within the line portion; a first ground line provided within the line portion on one side in a lamination direction with respect to the signal line and having a line width equal to or smaller than a line width of the signal line; and a second ground line provided within the line portion on another side in the lamination direction with respect to the signal line. The signal line overlaps the first ground line and the second ground line when seen in a planar view from the lamination direction.

A circuit board according to another preferred embodiment of the present invention includes a main body that includes a first board portion and second board portion on which electronic components are mounted, and a line portion connecting the first board portion to the second board portion and that includes a plurality of laminated insulating sheets made of a flexible material; a signal line provided within the line portion and extending between the first board portion and the second board portion; a first ground line provided within the line portion on one side in a lamination direction with respect to the signal line and having a line width equal to or smaller than a line width of the signal line; and a second ground line provided within the line portion on another side in the lamination direction with respect to the signal line. The signal line overlaps the first ground line and the second ground line when seen in a planar view from the lamination direction. The first board portion and the second board portion have structures that are less likely to deform than the line portion.

According to various preferred embodiments of the present invention, easy bending in a U shape can be performed and unwanted emission can be prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a signal transmission line and a circuit board according to preferred embodiments of the present invention will be described with reference to the drawings.

Figure 1:
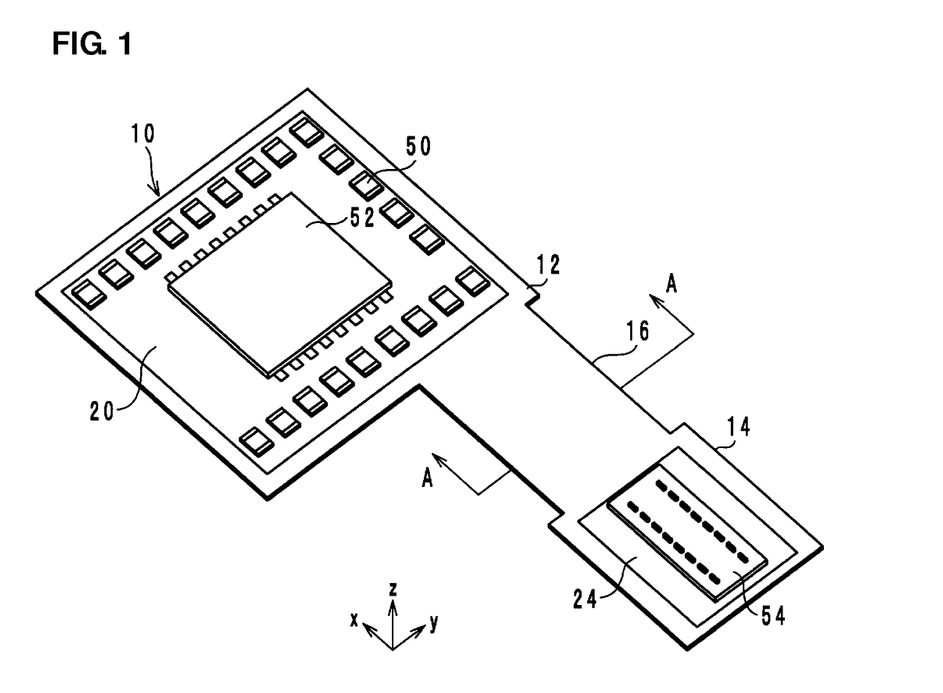
FIG. 1 is an external perspective view of a circuit board according to a preferred embodiment of the present invention.
Figure 2:
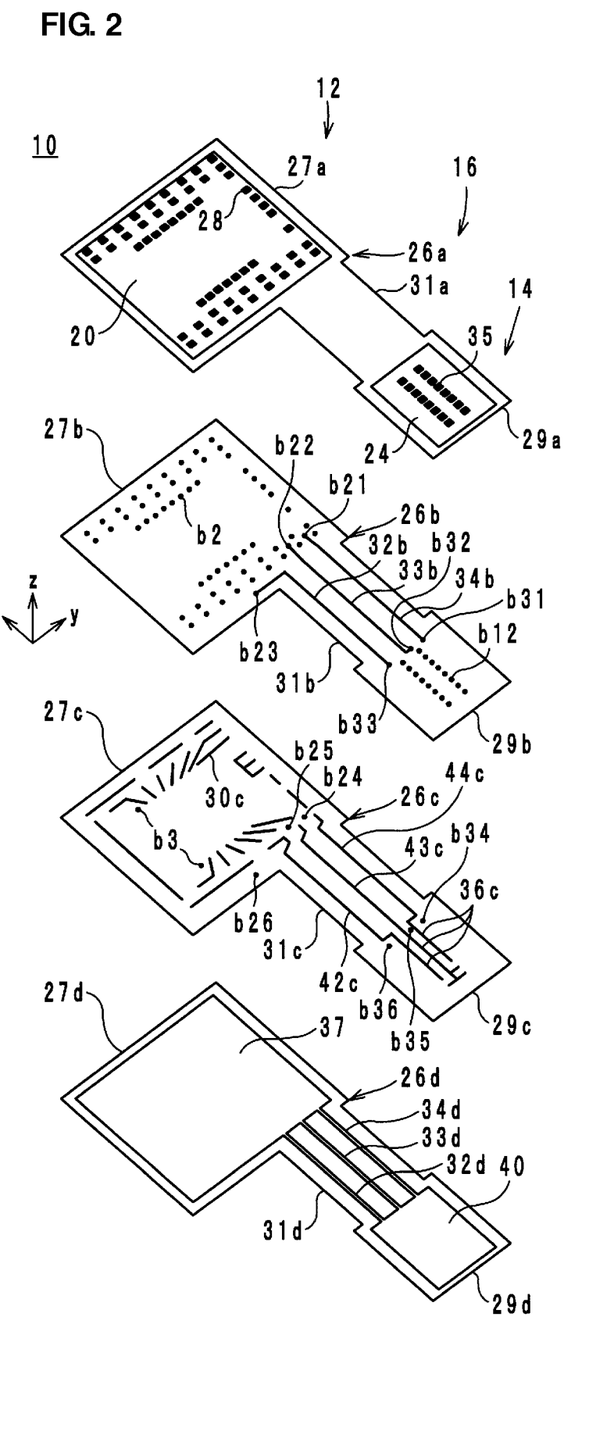
FIG. 2 is an exploded perspective view of the circuit board in FIG. 1.
Figure 3A:
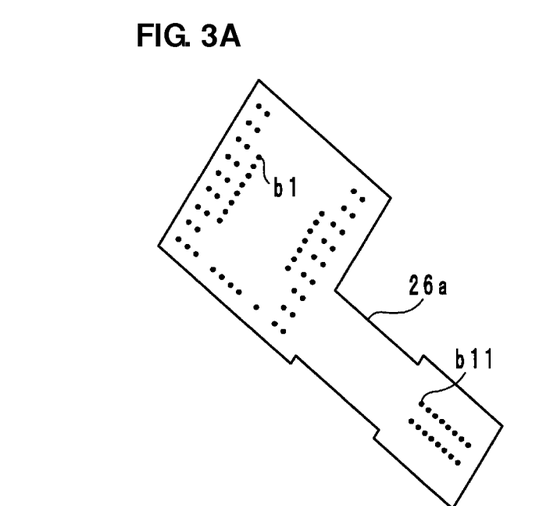
FIGS. 3A and 3B are perspective views of a flexible sheet of a circuit board in a manufacturing process.
Figure 3B:
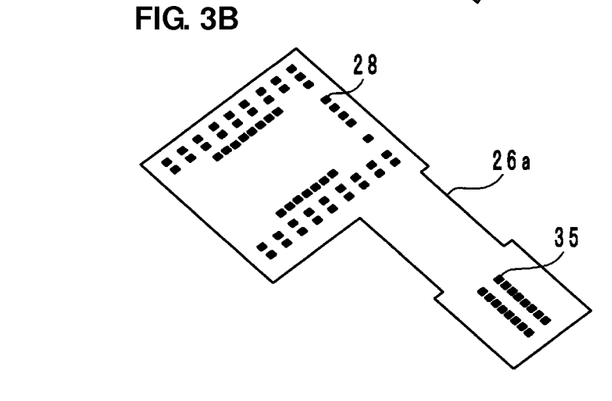
Figure 4:
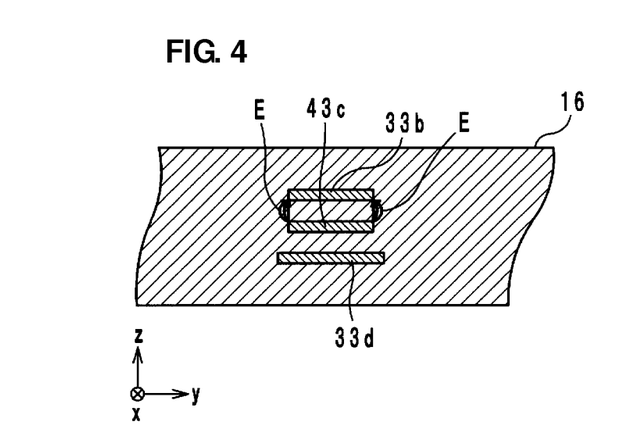
FIG. 4 is a cross-sectional structure diagram along A-A in FIG. 1.

Hereinafter, the configuration of a circuit board according to various preferred embodiments of the present invention will be described with reference to the drawings. FIG. 1 is an external perspective view of the circuit board 10 according to a preferred embodiment of the present invention. FIG. 2 is an exploded perspective view of the circuit board 10 in FIG. 1. FIGS. 3A and 3B are perspective views of a flexible sheet 26a of the circuit board 10 in a manufacturing process. FIG. 3A shows a back surface of the flexible sheet 26a, and FIG. 3B shows a front surface of the flexible sheet 26a in a state where resist films 20 and 24 are not formed thereon. FIG. 4 is a cross-sectional structure diagram along A-A in FIG. 1. In FIGS. 1 to 4, a lamination direction of the circuit board 10 is defined as a z-axis direction, and a longitudinal direction of a line portion 16 of the circuit board 10 is defined as an x-axis direction. The direction perpendicular to the x-axis direction and the z-axis direction is defined as a y-axis direction. It should be noted that front surfaces of the circuit board 10 and a flexible sheet 26 refer to surfaces located on a positive direction side in the z-axis direction, and back surfaces of the circuit board 10 and the flexible sheet 26 refer to surfaces located on a negative direction side in the z-axis direction.

As shown in FIG. 1, the circuit board 10 includes board portions 12 and 14 and the line portion (signal transmission line) 16. The board portion 12 preferably has a rectangular or substantially rectangular shape and has, in the front surface thereof, a mounting surface on which a plurality of chip elements (electronic components) 50 and an integrated circuit (electronic component) 52 are mounted. The board portion 14 preferably has a rectangular or substantially rectangular shape smaller than that of the board portion 12 and has, in the front surface thereof, a mounting surface on which a connector (electronic component) 54 is mounted. The line portion 16 connects the board portion 12 to the board portion 14. As shown in FIG. 2, the board portions 12 and 14 and the line portion 16 include laminated flexible sheets 26 (26a to 26d) made of a plurality (four in FIG. 2) of flexible materials (e.g., a thermoplastic resin such as a liquid crystal polymer), for example.

First, the board portion 12 will be described. As shown in FIG. 2, the board portion 12 preferably includes laminated board portion sheets 27a to 27d of the flexible sheets 26a to 26d. In addition, as shown in FIGS. 1 to 3B, the board portion 12 includes the resist film 20, lands 28, wiring conductors 30 (30c), a ground conductor 37, and via-hole conductors b1 to b3 and b21 to b26. In FIGS. 1 to 3B, with regard to the lands 28, the wiring conductors 30, and the via-hole conductors b1 to b3, the reference signs are provided to representative ones in order to prevent the drawings from being complicated.

As shown in FIG. 2, each land 28 is a conductor layer provided on the front surface of the board portion sheet 27a. As shown in FIG. 1, the chip elements 50 and the integrated circuit 52 are mounted on the lands 28 preferably via soldering, for example.

The resist film 20 is arranged so as to cover the front surface of the board portion sheet 27a, and is an insulating film provided to protect the board portion sheet 27a. It should be noted that the resist film 20 preferably is not provided on the lands 28. The resist film 20 is produced, for example, by applying a resin.

As shown in FIG. 2, each wiring conductor 30c preferably is a conductor layer provided on the front surface of the board portion sheet 27c. As shown in FIGS. 2 and 3A, the via-hole conductors b1 to b3 are arranged so as to extend through the board portion sheets 27a to 27c, respectively, in the z-axis direction. By the board portion sheets 27a to 27d being laminated, the lands 28, the wiring conductors 30c, and the via-hole conductors b1 to b3 are connected to each other to form a circuit.

As shown in FIG. 2, the via-hole conductors b21 to b23 are arranged so as to extend through the board portion sheet 27d in the z-axis direction. In addition, as shown in FIG. 2, the via-hole conductors b24 to b26 are arranged so as to extend through the board portion sheet 27c in the z-axis direction. The via-hole conductors b24 to b26 are connected to the via-hole conductors b21 to b23, respectively.

The ground conductor 37 is a conductor layer provided within the board portion 12. Specifically, the ground conductor 37 preferably is a rectangular film-shaped electrode arranged so as to cover the front surface of the board portion sheet 27d. It should be noted that as shown in FIG. 2, the ground conductor 37 does not cover the entire surface of the board portion sheet 27d and is not provided near the outer periphery of the board portion sheet 27d. In addition, the ground conductor 37 is grounded to be maintained at a ground potential. The ground conductor 37 is connected via the via-hole conductor b3 to the circuit that includes the lands 28, the wiring conductors 30c, and the via-hole conductors b1 to b3.

When seen in a planar view from the z-axis direction, as shown in FIG. 2, the resist film 20 and the ground conductor 37 have the same shapes and overlap each other so as to coincide with each other. When seen in a planar view from the z-axis direction, the lands 28 are provided in a region in which the resist film 20 and the ground conductor 37 are provided. Thus, as shown in FIG. 1, the chip elements 50 and the integrated circuit 52 are mounted in the region in which the resist film 20 and the ground conductor 37 are provided.

Next, the board portion 14 will be described. As shown in FIG. 2, the board portion 14 preferably includes laminated board portion sheets 29a to 29d of the flexible sheets 26a to 26d. In addition, as shown in FIGS. 1 to 3B, the board portion 14 includes the resist film 24, lands 35, wiring conductors 36 (36c), a ground conductor 40, and via-hole conductors b11, b12, and b31 to b36. In FIGS. 1 to 3B, with regard to the lands 35, the wiring conductors 36c, and the via-hole conductors b11 and b12, the reference signs are provided to representative ones in order to prevent the drawings from being complicated.

As shown in FIG. 2, each land 35 is a conductor layer provided on the front surface of the board portion sheet 29a.

As shown in FIG. 1, the connector 54 is mounted on the lands 35 preferably via soldering, for example.

The resist film 24 is arranged so as to cover the front surface of the board portion sheet 29a, and is an insulating film provided to protect the board portion sheet 29a. It should be noted that the resist film 24 is preferably not provided on the lands 35. The resist film 24 is produced, for example, by applying a resin.

As shown in FIG. 2, each wiring conductor 36c is a line-shaped conductor layer provided on the front surface of the board portion sheet 29c. As shown in FIGS. 2 and 3A, the via-hole conductors b11 and b12 are arranged so as to extend through the board portion sheets 29a and 29b, respectively, in the z-axis direction. By the board portion sheets 29a to 29d being laminated, the lands 35, the wiring conductors 36c, and the via-hole conductors b11 and b12 are connected to each other to form a circuit.

As shown in FIG. 2, the via-hole conductors b31 to b33 are arranged so as to extend through the board portion sheet 29b in the z-axis direction. In addition, as shown in FIG. 2, the via-hole conductors b34 to b36 are arranged so as to extend through the board portion sheet 29c in the z-axis direction. The via-hole conductors b34 to b36 are connected to the via-hole conductors b31 to b33, respectively.

The ground conductor 40 is a conductor layer provided within the board portion 12. Specifically, the ground conductor 40 preferably is a rectangular film-shaped electrode arranged so as to cover the front surface of the board portion sheet 29d. It should be noted that as shown in FIG. 2, the ground conductor 40 does not cover the entire surface of the board portion sheet 29d and is not provided near the outer periphery of the board portion sheet 29d. In addition, the ground conductor 40 is grounded to be maintained at the ground potential.

When seen in a planar view from the z-axis direction, as shown in FIG. 2, the resist film 24 and the ground conductor 40 have the same shapes and overlap each other so as to coincide with each other. When seen in a planar view from the z-axis direction, the lands 35 are provided in a region in which the resist film 24 and the ground conductor 40 are provided. Thus, as shown in FIG. 1, the connector 54 is mounted in the region in which the resist film 24 and the ground conductor 40 are provided.

Next, the line portion 16 will be described. As shown in FIG. 2, the line portion 16 includes laminated line portion sheets 31a to 31d of the flexible sheets 26a to 26d. In addition, as shown in FIGS. 1 and 2, the line portion 16 includes ground lines (32b and 32d), 33 (33b and 33d), and 34 (34b and 34d) and signal lines 42c, 43c, and 44c.

The signal lines 42c, 43c, and 44c are provided within the line portion 16 and extend between the board portions 12 and 14. Specifically, as shown in FIG. 2, the signal lines 42c, 43c, and 44c preferably are line-shaped conductor layers provided on the front surface of the line portion sheet 31c. In the signal lines 42c, 43c, and 44c, high-frequency signals (e.g., 800 MHz to 900 MHz) are transmitted. As shown in FIG. 2, the signal lines 42c, 43c, and 44c connect the wiring conductors 30c to the wiring conductors 36c.

The ground lines 32b, 33b, and 34b are provided within the line portion 16 and provided on the positive direction side in the z-axis direction with respect to the signal lines 42c, 43c, and 44c. Specifically, as shown in FIG. 2, the ground lines 32b, 33b, and 34b are provided on the front surface of the line portion sheet 31b and connect the via-hole conductors b21, b22, and b23 to the via-hole conductors b31, b32, and b33, respectively. Thus, the ground lines 32b, 33b, and 34b are connected to the ground conductor 37 via the via-hole conductors b21 to b26, respectively. In addition, the ground lines 32b, 33b, and 34b are connected to the ground conductor 40 via the via-hole conductors b31 to b36, respectively.

Further, as shown in FIG. 4, the ground lines 32b, 33b, and 34b have line widths (i.e., widths in the y-axis direction) equal to those of the signal lines 42c, 43c, and 44c (it should be noted that in FIG. 4, only the ground line 33b and the signal line 43c are shown). The ground lines 32b, 33b, and 34b overlap the signal lines 42c, 43c, and 44c, respectively, so as to coincide therewith, when seen in a planar view from the z-axis direction.

The ground lines 32d, 33d, and 34d are provided within the line portion 16 and provided on the negative direction side in the z-axis direction with respect to the signal lines 42c, 43c, and 44c. Specifically, as shown in FIG. 2, the ground lines 32d, 33d, and 34d are provided on the front surface of the line portion sheet 31d and connect the ground conductor 37 to the ground conductor 40.

Further, as shown in FIG. 4, the ground lines 32d, 33d, and 34d have line widths larger than those of the signal lines 42c, 43c, and 44c (it should be noted that in FIG. 4, only the ground line 33d and the signal line 43c are shown). Thus, when seen in a planar view from the z-axis direction, the signal lines 42c, 43c, and 44c overlap the ground lines 32d, 33d, and 34d, respectively, without protruding from the ground lines 32d, 33d, and 34d.

As described above, the ground lines 32b, 33b, and 34b, the signal lines 42c, 43c, and 44c, and the ground lines 32d, 33d, and 34d overlap each other. Thus, the ground line 32d, the signal line 42c, and the ground line 32d constitute a strip line. Similarly, the ground line 33b, the signal line 43c, and the ground line 33d constitute a strip line. The ground line 34b, the signal line 44c, and the ground line 34d constitute a strip line. Thus, impedance matching is provided between the circuit within the board portion 12 and the circuit within the board portion 14.

Further, as shown in FIGS. 1 and 2, in the circuit board 10, the ground conductors 37 and 40 are provided in the board portions 12 and 14. The ground conductors 37 and 40 serve to reinforce the board portions 12 and 14. Thus, the board portions 12 and 14 have structures that are less likely to deform as compared to the line portion 16. The chip elements 50, the integrated circuit 52, and the connector 54 are mounted on the board portions 12 and 14 that are less likely to deform.

Figure 5A:
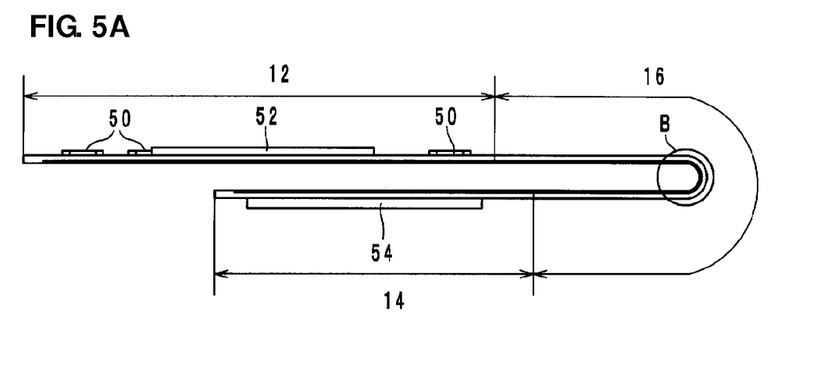
FIG. 5A is a cross-sectional structure diagram of the circuit board that is bent in a U shape.
Figure 5B:
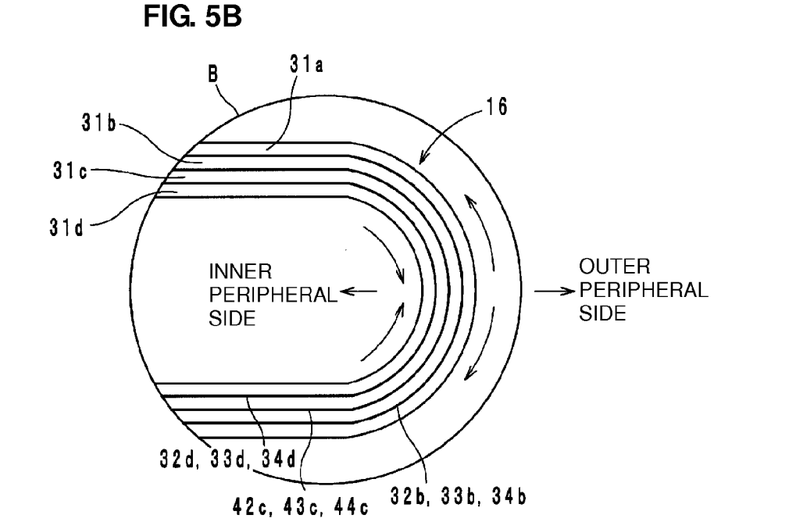
FIG. 5B is an enlarged view at B in FIG. 5A.

When being mounted in an electronic device, the circuit board 10 can be bent in a U shape. Hereinafter, the circuit board 10 that is bent in a U shape will be described with reference to the drawings. FIG. 5A is a cross-sectional structure diagram of the circuit board 10 that is bent in a U shape. FIG. 5B is an enlarged diagram at B in FIG. 5A.

As shown in FIG. 5A, the circuit board 10 is mounted in an electronic device in a state of being bent in a U shape. In other words, since the line portion 16 is bent in a U shape once, the board portion 14 extends on the lower side of the board portion 12. At that time, as shown in FIG. 5B, the ground lines 32b, 33b, and 34b are provided on the outer peripheral side of the line portion 16 with respect to the ground lines 32d, 33d, and 34d.

Hereinafter, a method of manufacturing the circuit board 10 will be described with reference to the drawings. In the following, the case where one circuit board 10 is manufactured will be described as an example. In reality, a plurality of circuit boards 10 are simultaneously manufactured by laminating and cutting large flexible sheets.

First, flexible sheets 26 including copper foil provided on the entirety of the front surface thereof are prepared. Next, a laser beam is applied from the back surface side to locations in the flexible sheets 26a to 26c where the via-hole conductors b1 to b3, b11, b12, b21 to b26, and b31 to b36 (see FIGS. 2 and 3A) are to be formed, to form via holes.

Next, the lands 28 and 35 shown in FIG. 3B are formed on the front surface of the flexible sheet 26a by a photolithographic process. Specifically, resists having the same shapes as those of the lands 28 and 35 shown in FIG. 3B are printed on the copper foil of the flexible sheet 26a. Then, etching treatment is performed on the copper foil to remove the portion of the copper foil that is not covered with the resists. Then, the resists are removed. By so doing, the lands 28 and 35 are formed on the front surface of the flexible sheet 26a as shown in FIG. 3B. Further, a resin is applied to the front surface of the flexible sheet 26a to form the resist films 20 and 24 shown in FIGS. 1 and 2.

Next, the ground lines 32b, 33b, and 34b shown in FIG. 2 are formed on the front surface of the flexible sheet 26b by a photolithographic process. Further, the wiring conductors 30c and 36c and the signal lines 42c, 43c, and 44c shown in FIG. 2 are formed on the front surface of the flexible sheet 26c by a photolithographic process. Further, the ground lines 32d, 33d, and 34d and the ground conductors 37 and 40 shown in FIG. 2 are formed on the front surface of the flexible sheet 26d by a photolithographic process. These photolithographic processes are the same as the photolithographic process performed when forming the lands 28 and 35, and thus the description thereof is omitted.

Next, the via holes formed in the flexible sheets 26a to 26c are filled with a conductive paste containing copper as a principal component, to form the via-hole conductors b1 to b3, b11, b12, b21 to b16, and b31 to b36 shown in FIGS. 2 and 3A.

Next, the flexible sheets 26a to 26d are stacked in order. Then, forces are applied to the flexible sheets 26a to 26d from the upper and lower directions in the z-axis direction, to pressure-bond the flexible sheets 26a to 26d. By so doing, the circuit board 10 shown in FIG. 1 is obtained.

According to the circuit board 10 described above, unwanted emission can be prevented as described below. Specifically, as shown in FIG. 4, the ground lines 32b, 33b, and 34b are provided on the positive direction side in the z-axis direction with respect to the signal lines 42c, 43c, and 44c, and the ground lines 32d, 33d, and 34d are provided on the negative direction side in the z-axis direction with respect to the signal lines 42c, 43c, and 44c. The ground lines 32b, 33b, and 34b, the signal lines 42c, 43c, and 44c, and the ground lines 32d, 33d, and 34d overlap each other when seen in a planar view from the z-axis direction. Thus, noise emitted from the signal lines 42c, 43c, and 44c is absorbed by the ground lines 32b, 32d, 33b, 33d, 34b, and 34d and is hardly emitted to the outside of the circuit board 10.

In the circuit board 10, the line widths of the ground lines 32b, 33b, and 34b are the same as the line widths of the signal lines 42c, 43c, and 44c. Thus, it is thought that unwanted emission cannot sufficiently be suppressed as compared to the strip line 200b shown in FIG. 8B. However, the circuit board 10 can sufficiently prevent unwanted emission due to the following reason. Superficially, in the circuit board 10, as shown in FIG. 4, the corners of the ground lines 32b, 33b, and 34b are close to the corners of the signal lines 42c, 43c, and 44c. As a result, due to the edge effect, most of electric force lines E generated from the corners of the signal lines 42c, 43c, and 44c extend toward the corners of the ground lines 32b, 33b, and 34b. Thus, the electric force lines E generated from the signal lines 42c, 43c, and 44c pass through the ground lines 32b, 33b, and 34b on the positive direction side or the negative direction side in the y-axis direction and hardly extend toward the outside of the circuit board 10. Due to this, the circuit board 10 can prevent unwanted emission.

Moreover, in the circuit board 10, as described below, even though the ground lines 32b, 33b, and 34b, the signal lines 42c, 43c, and 44c, and the ground lines 32d, 33d, and 34d constitute the strip lines, the line portion 16 can easily be bent in a U shape. Specifically, in the circuit board 10, the ground lines 32b, 33b, and 34b have the same line widths as those of the signal lines 42c, 43c, and 44c. Meanwhile, in the existing strip line 200b shown in FIG. 8B, the ground conductor 208 has a line width larger than that of the signal line 204. Thus, when the signal line 43c and the signal line 204 have equal line widths, the ground lines 32b, 33b, and 34b have line widths smaller than that of the ground conductor 208. As a result, in the circuit board 10, it is possible to easily bend the line portion 16 in a U shape as compared to the strip line 200b. As described above, the circuit board 10 can prevent unwanted emission and can easily be bent in a U shape.

Further, the circuit board 10 can easily be bent in a U shape due to the following reason as well. Specifically, as shown in FIG. 5B, in the bent line portion 16, the stretch amounts of the ground lines 32b, 33b, and 34b, the signal lines 42c, 43c, and 44c, and the ground lines 32d, 33d, and 34d increase from the inner peripheral side toward the outer peripheral side. Thus, in the circuit board 10, of the ground lines 32b, 32d, 33b, 33d, 34b, and 34d, the ground lines 32b, 33b, and 34b that are easily stretchable due to their small line widths are provided on the outer peripheral side of the ground lines 32d, 33d, and 34d. This makes it possible to easily bend the circuit board 10 in a U shape.

Further, the circuit board 10 can prevent entry of noise, generated at the chip elements 50 and the integrated circuit 52, into the connector 54, and entry of noise, generated at the connector 54, into the chip elements 50 and the integrated circuit 52. Specifically, as shown in FIGS. 5A and 5B, the mounting surfaces of the board portions 12 and 14 do not face each other. Thus, the ground conductors 37 and 40 are present between the mounting surface of the board portion 12 and the mounting surface of the board portion 14. The ground conductors 37 and 40 are grounded and hence serve as shields. Therefore, noise generated at the chip elements 50 and the integrated circuit 52 is absorbed by the ground conductors 37 and 40, and entry of the noise into the connector 54 is prevented. Similarly, noise generated at the connector 54 is absorbed by the ground conductors 37 and 40, and entry of the noise into the chip elements 50 and the integrated circuit 52 is prevented.

Figure 6:
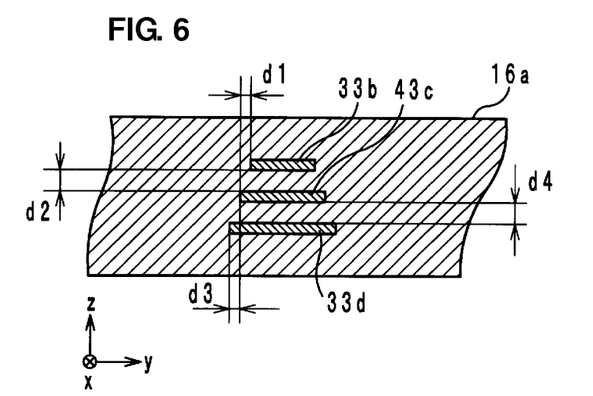
FIG. 6 is a cross-sectional structure diagram of a line portion according to a first modified example of a preferred embodiment of the present invention.
Figure 7:
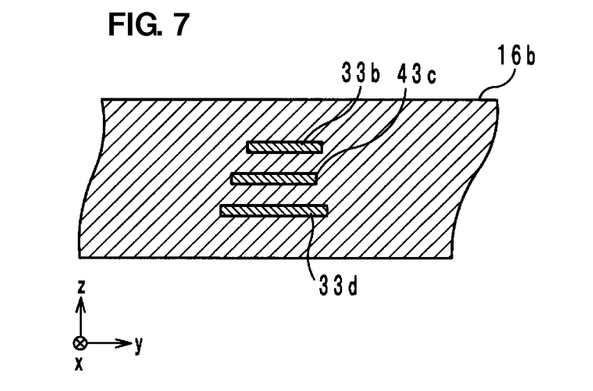
FIG. 7 is a cross-sectional structure diagram of a line portion according to a second modified example of a preferred embodiment of the present invention.

Hereinafter, modified examples of the line portion 16 will be described with reference to the drawings. FIG. 6 is a cross-sectional structure diagram of a line portion 16a according to a first modified example. FIG. 7 is a cross-sectional structure diagram of a line portion 16b according to a second modified example.

As shown in FIG. 6, the ground lines 32b, 33b, and 34b may have line widths smaller than those of the signal lines 42c, 43c, and 44c (in FIG. 6, only the ground line 33b and the signal line 43c are shown). In this case, the widths d1, in the y-axis direction (in the line width direction), of the portions of the signal lines 42c, 43c, and 44c that protrude from the ground lines 32b, 33b, and 34b when seen in a planar view from the z-axis direction, are smaller than the intervals d2 in the z-axis direction between the ground lines 32b, 33b, and 34b and the signal lines 42c, 43c, and 44c. This is because when the width d1 is larger than the interval d2, the edge effect becomes weak and hence the electric force lines generated from the signal lines 42c, 43c, and 44c do not extend toward the ground lines 32b, 33b, and 34b.

In the line portion 16a shown in FIG. 6, when seen in a planar view from the z-axis direction, the ground lines 32b, 33b, and 34b desirably overlap the signal lines 42c, 43c, and 44c without protruding from the signal lines 42c, 43c, and 44c. By so doing, the corners of the signal lines 42c, 43c, and 44c can be made close to the corners of the ground lines 32b, 33b, and 34b and hence it is possible to greatly exert the edge effect.

However, the above description does not exclude protrusion of the ground lines 32b, 33b, and 34b from the signal lines 42c, 43c, and 44c when seen in a planar view from the z-axis direction as in the line portion 16b shown in FIG. 7.

The widths of the ground lines 32d, 33d, and 34d shown in FIG. 6 have to be such widths that at least the electric force lines extending from the signal lines 42c, 43c, and 44c toward the ground lines 32d, 33d, and 34d perpendicularly enter the surfaces of the ground lines 32d, 33d, and 34d that face the signal lines 42c, 43c, and 44c. In other words, the widths d3, in the y-axis direction (the line width direction), of the portions of the ground lines 32d, 33d, and 34d that protrude from the signal lines 42c, 43c, and 44c when seen in a planar view from the z-axis direction have to be as large as about half the intervals d4 in the z-axis direction between the signal lines 42c, 43c, and 44c and the ground lines 32d, 33d, and 34d. For example, when d4 is about 100 µm, d3 is preferably about 50 µm. By so doing, the electric force lines extending from the signal lines 42c, 43c, and 44c toward the ground lines 32d, 33d, and 34d perpendicularly or substantially perpendicular enter the surfaces of the ground lines 32d, 33d, and 34d that face the signal lines 42c, 43c, and 44c, and do not extend around to the surfaces of the ground lines 32d, 33d, and 34d that are parallel or substantially parallel to the z-axis direction and to the surfaces of the ground lines 32d, 33d, and 34d that are opposite to the surfaces of the ground lines 32d, 33d, and 34d that face the signal lines 42c, 43c, and 44c. Thus, it is easy to design the impedance of the signal transmission line that is a component between a microstrip line and a strip line. Further, variation of the impedance of the signal transmission line due to processing can be reduced, and a stable signal transmission line can be achieved.

The circuit board 10 has been described. However, the structures of the line portions 16, 16a, and 16b are applicable to things other than the circuit board 10. Specifically, the structures of the line portions 16, 16a, and 16b may be used for a signal transmission line (cable) connecting between circuit boards.

Preferred embodiments of the present invention are useful for signal transmission lines and circuit boards, and in particular, are excellent in being able to easily be bent in a U shape and to reduce unwanted emission.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A signal transmission line comprising:
a line portion including stacked insulating sheets made of a flexible material such that the line portion can be bent;
a signal line extending within the line portion;
a first conductive layer provided within the line portion on one side in a lamination direction with respect to the signal line and having a line width equal to or smaller than a line width of the signal line; and
a second conductive layer provided within the line portion on another side in the lamination direction with respect to the signal line and having a line width larger than a line width of the signal line; wherein
the signal line overlaps the first conductive layer and the second conductive layer when seen in a planar view from the lamination direction;
the signal line is provided between the first conductive layer and the second conductive layer without any other conductive layer; and
the second conductive layer includes a first end and a second end opposite to the first end, the first end being electrically connected a first ground conductor and the second end being electrically connected to a second ground conductor.

2. The signal transmission line according to claim 1, wherein a width, in a line width direction, of a portion of the signal line that protrudes from the first conductive layer when seen in a planar view from the lamination direction is smaller than an interval in the lamination direction between the signal line and the first conductive layer.

3. The signal transmission line according to claim 2, wherein the line portion is bent, and the first conductive layer is provided on an outer peripheral side of the bent line portion with respect to the second conductive layer.

4. The signal transmission line according to claim 1, wherein the signal line overlaps the second conductive layer without protruding from the second conductive layer, when seen in a planar view from the lamination direction.

5. The signal transmission line according to claim 1, wherein the first conductive layer overlaps the signal line without protruding from the signal line, when seen in a planar view from the lamination direction.

6. A circuit board comprising:
a main body that includes a first board portion and second board portion on which electronic components are mounted, and a line portion connecting the first board portion to the second board portion and that includes a plurality of laminated stacked insulating sheets made of a flexible material such that the line portion can be bent;
a signal line provided within the line portion and extending between the first board portion and the second board portion;
a first conductive layer provided within the line portion on one side in a lamination direction with respect to the signal line and having a line width equal to or smaller than a line width of the signal line; and
a second conductive layer provided within the line portion on another side in the lamination direction with respect to the signal line and having a line width larger than a line width of the signal line; wherein
the signal line overlaps the first conductive layer and the second conductive layer when seen in a planar view from the lamination direction;
the first board portion and the second board portion are less deformable than the line portion;
the signal line is provided between the first conductive layer and the second conductive layer without any other conductive layer;
a first ground conductor is provided within the first board portion;
a second ground conductor is provided within the second board portion; and
the second conductive layer includes a first end and a second end opposite to the first end, the first end being electrically connected the first ground conductor and the second end being electrically connected to the second ground conductor.

7. The circuit board according to claim 6, wherein a width, in a line width direction, of a portion of the signal line that protrudes from the first conductive layer when seen in a planar view from the lamination direction is smaller than an interval in the lamination direction between the signal line and the first conductive layer.

\* \* \* \* \*